(12) United States Patent
Jeraj et al.

(10) Patent No.: US 11,750,427 B1
(45) Date of Patent: Sep. 5, 2023

(54) LOW-NOISE HIGHLY-LINEAR WIDEBAND VECTOR MODULATORS

(71) Applicant: L3Harris Technologies, Inc., Melbourne, FL (US)

(72) Inventors: Janez Jeraj, Farmington, UT (US); Larry S. Thomson, Kaysville, UT (US); Roy E. Prymek, West Jordan, UT (US)

(73) Assignee: L3HARRIS TECHNOLOGIES, INC., Melbourne, FL (US)

( * ) Notice: Subject to any disclaimer, the term of this patent is extended or adjusted under 35 U.S.C. 154(b) by 0 days.

(21) Appl. No.: 17/736,743

(22) Filed: May 4, 2022

(51) Int. Cl.
| | |
|---|---|
| *H04L 27/20* | (2006.01) |
| *H04L 27/12* | (2006.01) |
| *H04L 27/26* | (2006.01) |
| *H04L 27/10* | (2006.01) |
| *H04L 27/01* | (2006.01) |

(52) U.S. Cl.
CPC .......... *H04L 27/2007* (2013.01); *H04L 27/01* (2013.01); *H04L 27/122* (2013.01); *H04L 27/2602* (2013.01)

(58) Field of Classification Search
CPC ... H04L 27/01; H04L 27/122; H04L 27/2007; H04L 27/2602; H04L 27/12; H04L 27/127; H04L 27/2021; H04B 3/03; H04B 3/04; H04B 3/06; H04B 3/14; H04B 3/141–148; H04B 7/005
See application file for complete search history.

(56) References Cited

U.S. PATENT DOCUMENTS

| | | | | | |
|---|---|---|---|---|---|
| 3,411,110 | A | * | 11/1968 | Walker | H03C 1/60 332/170 |
| 3,727,136 | A | * | 4/1973 | Schroeder | H04L 27/01 375/236 |
| 3,825,843 | A | * | 7/1974 | Felsberg | H03F 1/3252 327/317 |
| 3,845,390 | A | * | 10/1974 | De Jager | H04B 3/141 375/232 |
| 4,466,134 | A | * | 8/1984 | McNicol | H04B 7/005 455/311 |

(Continued)

OTHER PUBLICATIONS

K. E. Kolodziej and B. T. Perry, Wideband vector modulator for RF cancellers in STAR systems, IEEE Radio and Wireless Symposium (RWS), Anaheim, CA, 2018, pp. 64-67.

(Continued)

*Primary Examiner* — James M Perez
(74) *Attorney, Agent, or Firm* — Workman Nydegger (57) ABSTRACT

Vector modulation is illustrated. A method includes receiving an input signal. The input signal is split into a first 0° output and a 90° output. The first 0° output is split into a second 0° output and a first 180° output using a continuous transmission line. The 90° output is split into a third 0° output and a second 180° output using a continuous transmission line. The second 0° output, the first 180° output, the third 0° output, and the second 180° output are modulated. The modulated second 0° output, the first 180° output, the third 0° output, and the second 180° output are recombined to produce an output signal, where all four of the modulated second 0° output, the first 180° output, the third 0° output, and the second 180° output are used to create the output signal.

20 Claims, 7 Drawing Sheets

(56) References Cited

U.S. PATENT DOCUMENTS

| | | | | |
|---|---|---|---|---|
| 4,673,898 | A * | 6/1987 | Redmond | H01P 5/16 332/170 |
| 4,968,967 | A * | 11/1990 | Stove | G01S 7/038 342/165 |
| 4,970,519 | A * | 11/1990 | Minnis | G01S 13/32 342/194 |
| 5,303,412 | A * | 4/1994 | Kushner | H04L 27/122 455/260 |
| 5,506,549 | A * | 4/1996 | Crutcher | H04B 3/145 333/28 R |
| 5,781,589 | A * | 7/1998 | Yom | H04L 25/03159 375/261 |
| 6,531,935 | B1 | 3/2003 | Russat | H03C 1/60 332/146 |
| 7,023,292 | B2 * | 4/2006 | Pehlke | H04L 27/361 332/149 |
| 7,184,723 | B2 * | 2/2007 | Sorrells | H03F 3/24 455/114.3 |
| 7,519,348 | B2 * | 4/2009 | Shah | H03D 7/14 455/302 |
| 7,639,072 | B2 * | 12/2009 | Sorrells | H03F 1/32 330/147 |
| 7,885,682 | B2 * | 2/2011 | Sorrells | H03F 1/30 455/143 |
| 8,013,675 | B2 * | 9/2011 | Rawlins | H03F 1/0294 330/147 |
| 8,031,804 | B2 * | 10/2011 | Sorrells | H04L 27/366 375/229 |
| 8,295,392 | B2 * | 10/2012 | Teramoto | H04L 25/03885 375/230 |
| 8,798,216 | B2 * | 8/2014 | Pullela | H04B 1/30 455/302 |
| 9,191,127 | B2 * | 11/2015 | Koli | H04B 15/00 |
| 9,246,719 | B2 * | 1/2016 | Pullela | H03D 7/165 |
| 9,287,846 | B2 * | 3/2016 | Lindenmeier | H01P 1/184 |
| 9,344,038 | B2 * | 5/2016 | Hur | H04L 27/22 |
| 9,564,935 | B2 * | 2/2017 | Kurihara | H03F 1/0288 |
| 9,602,184 | B2 * | 3/2017 | Honda | H03F 1/0277 |
| 9,729,119 | B1 | 8/2017 | Blatz | H04B 17/318 |
| 9,893,924 | B2 * | 2/2018 | Smail | H04L 27/3881 |
| 9,923,269 | B1 * | 3/2018 | Hageman | H01Q 3/36 |
| 10,027,358 | B2 * | 7/2018 | Wu | H03D 7/1466 |
| 10,199,703 | B2 * | 2/2019 | Koul | H01P 1/12 |
| 10,690,780 | B1 * | 6/2020 | Zarubica | G01S 19/32 |
| 10,735,040 | B2 * | 8/2020 | Robinson | H04B 1/16 |
| 10,812,118 | B2 * | 10/2020 | Kolodziej | H04B 1/10 |
| 10,812,136 | B1 * | 10/2020 | Henry | H04B 3/36 |
| 10,911,061 | B2 * | 2/2021 | Cameron | G01C 21/188 |
| 10,935,624 | B2 * | 3/2021 | Zarubica | G01S 3/043 |
| 10,951,265 | B1 * | 3/2021 | Henry | H04B 3/36 |
| 11,050,594 | B2 * | 6/2021 | Norris | H04J 13/0077 |
| 11,165,609 | B2 * | 11/2021 | Gao | H04L 25/0286 |
| 11,336,493 | B1 * | 5/2022 | Patel | H04L 27/01 |
| 11,356,136 | B2 * | 6/2022 | Emira | H04B 1/1615 |
| 11,362,698 | B2 * | 6/2022 | Holzer | H04B 1/44 |
| 11,581,644 | B2 * | 2/2023 | Yu | H03F 1/0277 |
| 11,611,423 | B2 * | 3/2023 | Kolodziej | H04B 17/345 |
| 11,616,492 | B1 * | 3/2023 | Jeraj | H03K 5/01 327/552 |
| 2003/0016762 | A1 * | 1/2003 | Martin | H04L 27/2007 332/144 |
| 2006/0293017 | A1 * | 12/2006 | Kim | H03D 7/1491 455/323 |
| 2008/0284487 | A1 * | 11/2008 | Pullela | H03D 7/1466 327/355 |
| 2009/0103742 | A1 * | 4/2009 | Ribic | H04R 25/35 381/60 |
| 2009/0143031 | A1 * | 6/2009 | Shah | H04B 1/28 455/150.1 |
| 2009/0168864 | A1 * | 7/2009 | Teramoto | H04L 25/03885 375/232 |
| 2009/0203345 | A1 * | 8/2009 | Sorrells | H04L 27/06 455/313 |
| 2011/0051780 | A1 * | 3/2011 | Kawasaki | H04L 27/122 375/135 |
| 2011/0150069 | A1 * | 6/2011 | Jamin | H03H 11/04 375/229 |
| 2012/0063555 | A1 * | 3/2012 | Pullela | H04B 1/006 375/350 |
| 2017/0019272 | A1 * | 1/2017 | Brannon | H04L 5/14 |
| 2017/0104502 | A1 * | 4/2017 | Pratt | H04L 27/368 |
| 2020/0350679 | A1 * | 11/2020 | Yu | H03F 3/45179 |

OTHER PUBLICATIONS

Y. Hua, Y. Li, C. Mauskar and Q. Zhu, Blind digital tuning for interference cancellation in full-duplex radio, 2014 48th Asilomar Conference on Signals, Systems and Computers, Pacific Grove, CA, 2014, pp. 1691-1695.

S. Hong, J. Brand, J. Choi, M. Jain, J. Mehlman, S. Katti, and P. Levis, Applications of Self-Interference Cancellation in 5G and Beyond, IEEE Communications Magazine, vol. 52, pp. 114-121, Feb. 2014.

D. Korpi, T. Riihonen, A. Sabharwal, and M. Valkma, Transmit power optimization and feasibility analysis of self-backhauling full-duplex radio access systems, IEEE Transactions on Wireless Communications, in press, 2018.

D. Korpi, M. Turunen, L. Anttila, and M. Valkama, Modeling and cancellation of self-interference in full-duplex radio transceivers: Volterra series-based approach, to be presented in the IEEE International Conference on Communications Workshops (ICC Workshops), May 2018.

D. Bharadia, E. Mcmilin, S. Katti, Full Duplex Radios, Proc. of ACM SIGCOMM, 2013.

\* cited by examiner

LOW-NOISE HIGHLY-LINEAR WIDEBAND VECTOR MODULATORS

BACKGROUND

Background and Relevant Art

There is often a need to modulate phase and amplitude of communication signals. Often, at least a portion of this can be performed using phase shifters. However, phase shifters typically have low bandwidth, low dynamic range (i.e., poor linearity), low phase-shift resolution (usually they are digitally controlled with 6-bit or 8-bit realizations) and often relatively high Noise Figure (NF). Therefore, phase shifters are not very attractive to use in some systems. Vector modulators on the other hand offer wider frequency tuning ranges by performing both amplitude and phase adjustments using only power splitters, power combiners, hybrid couplers and attenuator components.

Thus, vector modulators are used in many analog RF systems. In a vector modulator a signal is split into two signals that are 90 degrees apart—in phase (I) and quadrature (Q). By varying the magnitude of the I and Q vectors, the amplitude and phase of the original RF signal may be modified. The quadrature signals are passed through independent variable attenuators that produce the desired amplitude and phase. The two vectors are then re-combined using an in-phase combiner (e.g., Wilkinson) and the output analog RF signal now has a new magnitude and phase.

Vector modulators are used in various different applications. For example, vector modulators may be used for co-site interference cancellation where an interferer is being cancelled. Vector modulators may be used for signal cancellation in Simultaneous Transmit and Receive (STAR) systems. Vector modulators may be used in In-Band Full-Duplex (IBFD) communications systems such as for the fifth-generation (5G) wireless systems. Vector modulators may be used in pre-distortion or feedforward linearization. Vector modulators may be used in beamforming and nulling circuits. Vector modulators may be used in cellular and WiMAX systems. Vector modulators may be used in wireless infrastructure, etc. Thus, vector modulators have broad applicability.

Current vector modulators are relatively narrowband. Further, current vector modulators have limited dynamic range. Dynamic range in current state of the art vector modulators are limited on both ends: at the noise floor as well as the high-power end where they often exhibit compression and other nonlinear behavior. This is due to the architecture and the components used to implement such vector modulators, such as active components or passive, noisy switches.

Further, current vector modulators have limitations as to amplitude and/or phase of signals that can be produced. For example, ideal I and Q vectors cannot always be achieved meaning that certain magnitudes and phases cannot be achieved.

Thus, it would be useful to have improved vector modulators that are wider band than current devices, have higher dynamic range, have fewer limitations on signals that can be produced, etc.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

One embodiment illustrated herein includes a method of performing vector modulation. The method includes receiving an input signal. The input signal is split into a first 0° output and a 90° output. The first 0° output is split into a second 0° output and a first 180° output using a continuous transmission line. The 90° output is split into a third 0° output and a second 180° output using a continuous transmission line. The second 0° output, the first 180° output, the third 0° output, and the second 180° output (which constitute 0°, 90°, 180° and 270°) are modulated. The modulated second 0° output, the first 180° output, the third 0° output, and the second 180° output are recombined to produce an output signal, where all four of the modulated second 0° output, the first 180° output, the third 0° output, and the second 180° output are used to create the output signal.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Embodiments illustrated herein include a hybrid coupler, low-noise, highly-linear wideband vector modulator (VM). An RF vector modulator as illustrated here performs a phase shift function as well as amplitude adjustment of an analog RF input signal. Embodiments can meaningfully improve the dynamic range, bandwidth of currently available vector modulator technology, accuracy and range of vector modulation.

A vector modulator receives an input signal and produces an output that is both shifted in phase by an amount between 0° and 360° and adjusted in amplitude over a specific attenuation range. A block diagram of a vector modulator 100 implementing various aspects of the invention is shown in FIG. 1.

Figure 1:
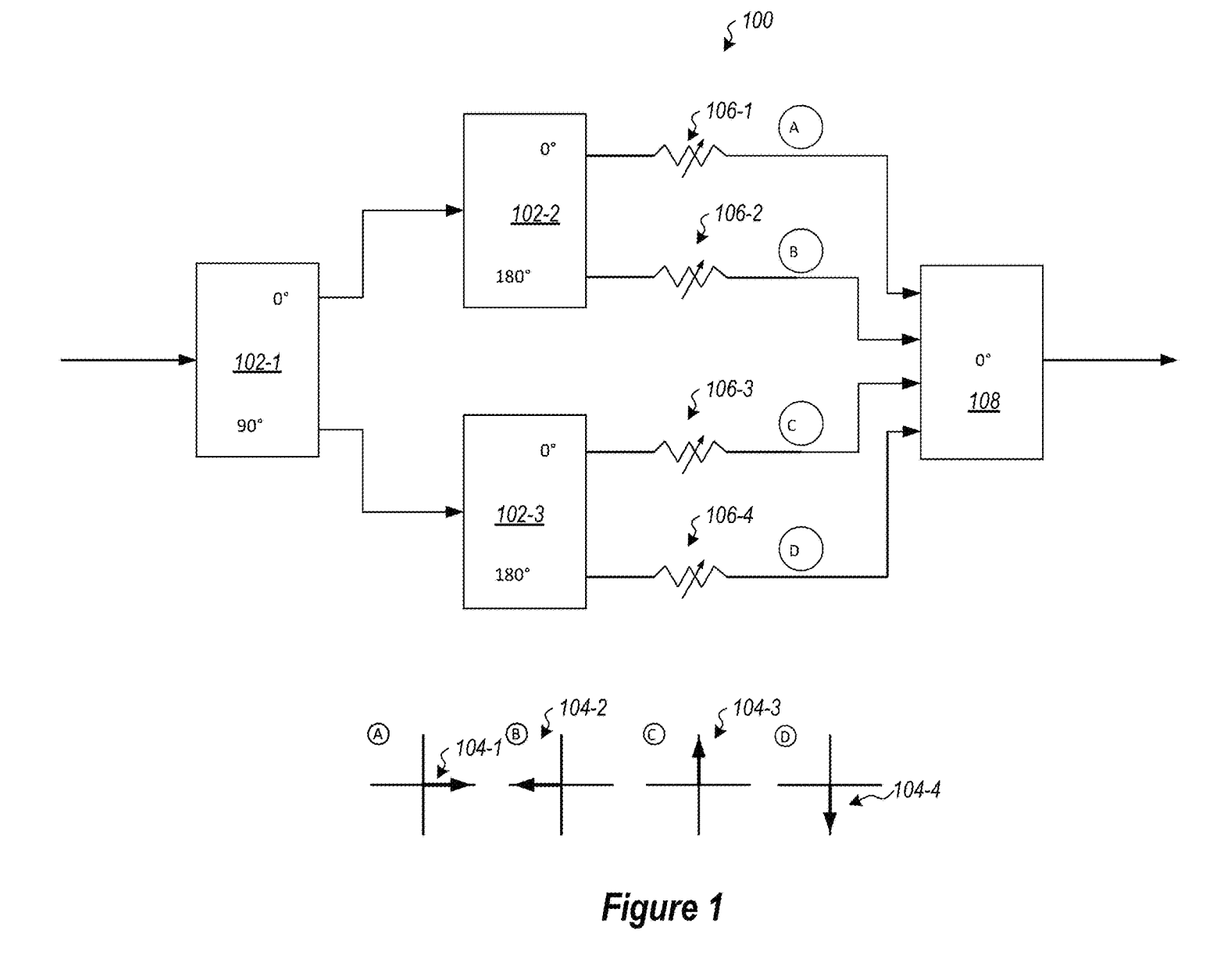
FIG. 1 illustrates a vector modulator.

RF hybrid couplers 102-1, 102-2, and 102-3 (in various combinations of 90° and 180° shifts) split the input signal into four components (+I, −I, +Q, −Q) which are ideally offset by 90° as highlighted by the unit vectors 104-1, 104-2, 104-3, and 104-4 in FIG. 1. Note that as illustrated in FIG. 1, the RF hybrid couplers include a 90° RF hybrid coupler 102-1 (having a 0° output port and a 90° output port) and two 180° RF hybrid couplers 102-2 and 102-3 (each having a 0° output port and a 180° output port). In this particular embodiment, the RF hybrid couplers are implemented as shown as discrete components. In particular, in some embodiments the two 180° RF hybrid couplers 102-2 and 102-3 are implemented using a continuous transmission line (i.e., with no intervening connectors or switches connecting discrete portions of the transmission line) having four ports, including an input, an isolated port, a 180° shift port, and a 0° shift port. For example, a rat-race hybrid coupler can be used to implement the hybrid couplers 102-2 or 102-3, rather than using two 90° RF hybrid couplers coupled together with an intervening connector to create at 180° hybrid coupler. In particular, if a 180° RF hybrid coupler was constructed using two 90° hybrid couplers, this typically requires terminating unused ports with impedances matching the transmission line characteristics, which results in signal losses. In contrast, using a 180° hybrid coupler implemented using a continuous transmission line results in no unused ports, and thus, no need to terminate any unused ports.

Each of the four component signals are modulated using controllable attenuators 106-1, 106-2, 106-3, and 106-4, such as Voltage Variable Attenuators (VVA) or Digital Step Attenuators (DSA). The signals are summed using analog RF power combiner 108 (which can be a 4-way combiner such as shown in FIG. 1 or a set of 2-way RF power combiners).

Figure 2:
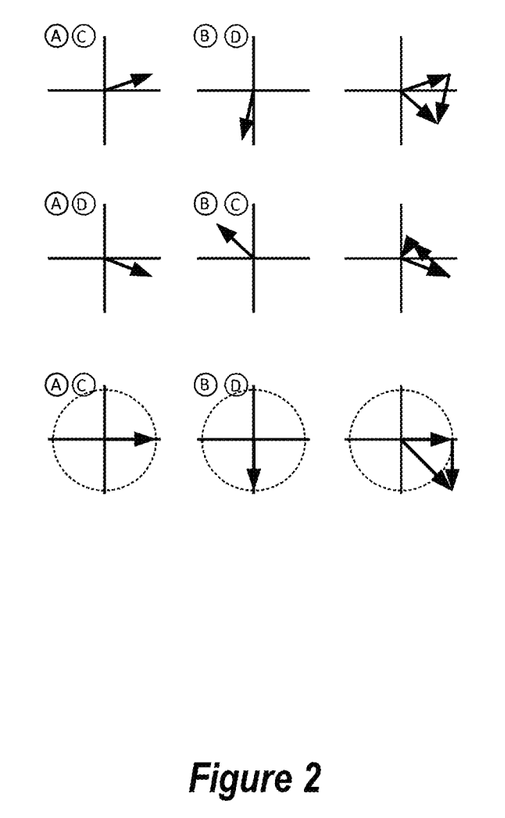
FIG. 2 illustrates various examples of vectors that can be constructed using two sets of sub vectors.

Referring now to FIG. 2, various examples of vectors that can be constructed using two sets of sub-vectors facilitated by the present invention are illustrated.

Figure 3:
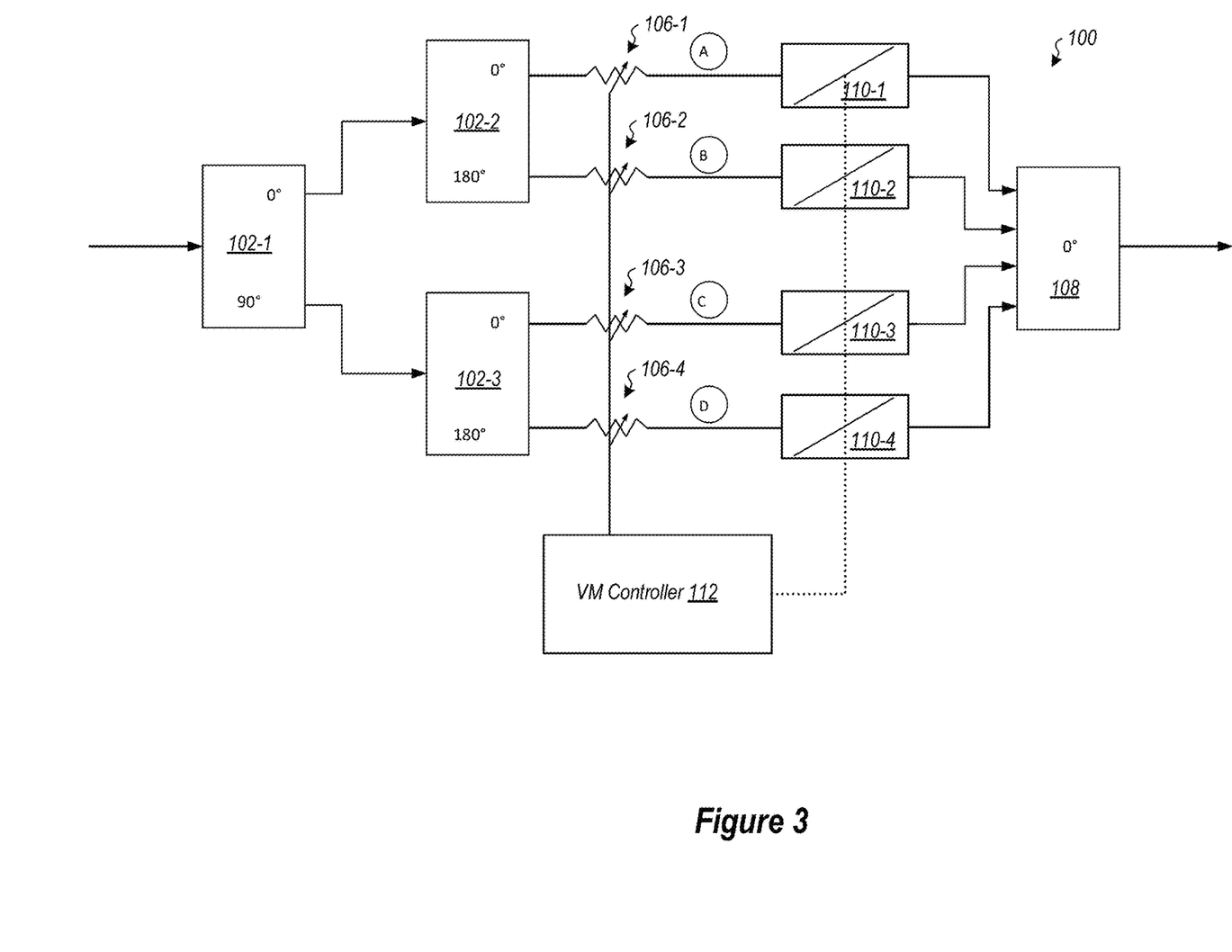
FIG. 3 illustrates a vector modulator having gain slope equalizers toward an output side.
Figure 4:
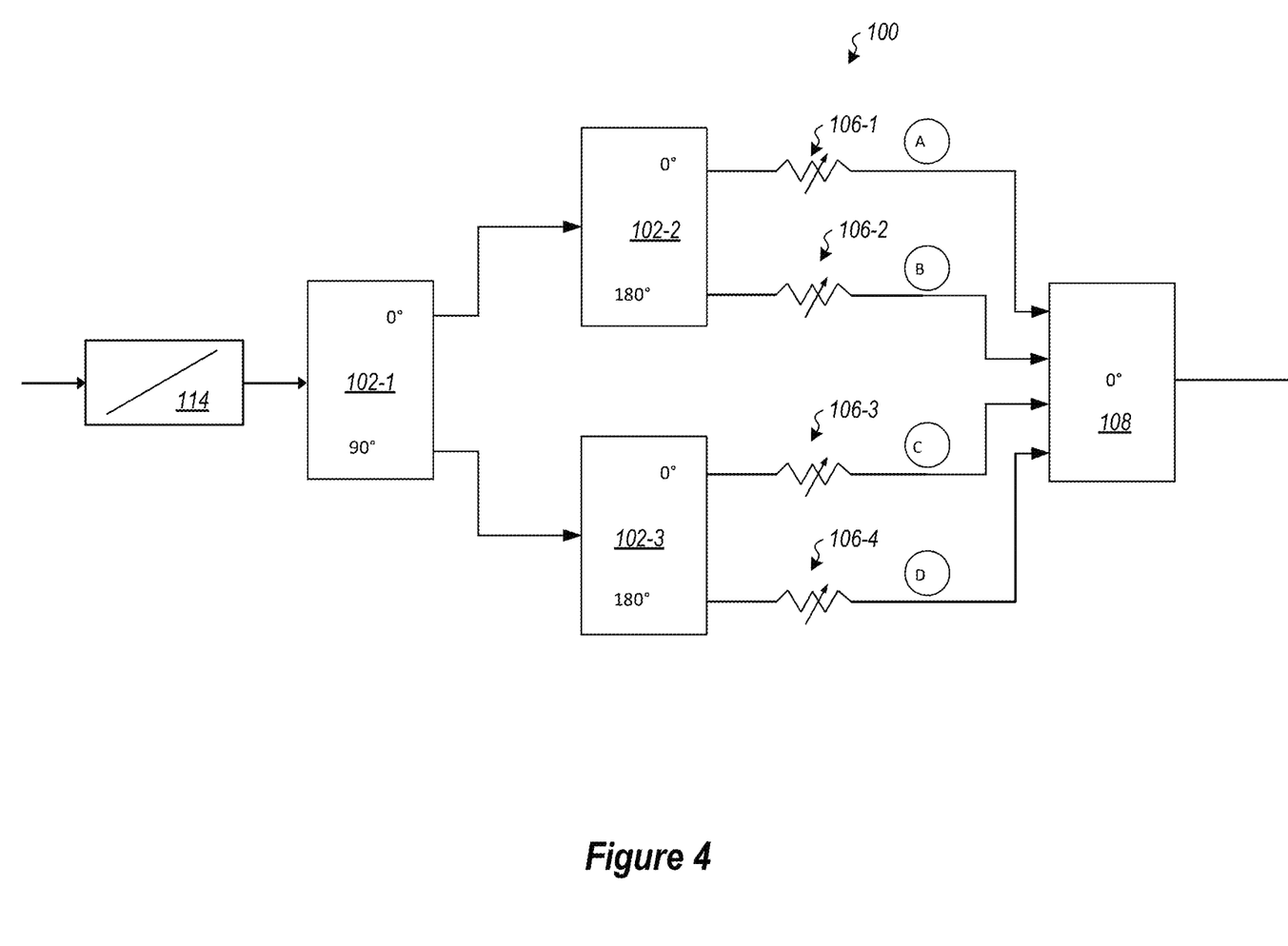
FIG. 4 illustrates a vector modulator having gain slope equalizers toward an input side.

Wide-band microwave systems, including power splitters/combiners/hybrid couplers and microstrip/stripline transmission lines have a negative gain slope. In particular, the components have a "filter" response that causes losses in the system and reduces the quality of vector modulation process. As illustrated in FIG. 3, to improve performance on a wide-band system, embodiments may also include gain slope equalizers 110-1, 110-2, 110-3, and 110-4 that have a (positive) gain slope to compensate for system losses caused by lossy components, environmental factors (such as temperature, humidity, etc.), circuit component imperfections such as nonlinearities and bandwidth dependent deviations from desired response, etc. These slope equalizers, ideally have an opposite "filter" response, such as an opposite filter response to the lossy components. The gain slope equalizers are implemented between the input hybrid couplers and output power combiner. In alternative embodiments, when components are fairly well matched in the system, a gain slope equalizer 114 may be located at the input side of the first hybrid coupler 102-1 as shown in FIG. 4.

In some embodiments, the gain slope equalizers are passive with a fixed slope, where the fixed slope is based on known characteristics of other components, and can be in any one of a number for different forms. For example, in some embodiments, a slope equalizer can be in the form of a conventional surface-mount attenuator chip (or thin\thick film implementation), where a chip attenuator, with some added inductance, is mounted to ground. An alternative, a more sophisticated passive gain slope equalizer can be based on an attenuator network such as a tee. In some examples, a gain slope equalizer may be implemented using various transmission lines. A gain slope equalizer may have a low order band pass filter gain characteristic. Band pass filtering can be achieved in a variety of ways including but not limited by resistors, capacitors and inductors.

In alternative embodiments, the slope equalizers may be adjustable. For example, as shown in FIG. 3, a vector modulator controller 112 is illustrated. The vector modulator controller 112 is shown as being connected to the slope equalizers via a dotted line indicating that adjustability of the slope equalizers is optional.

Thus, fixed-slope and/or adjustable-slope variable equalizers can be used for gain flattening and frequency-dependent loss compensation. In particular, slope equalizers can be used to correct for the broadband insertion loss of the system. In some embodiments, passive gain equalizers (as opposed to powered active equalizers) are used to preserve linearity and low noise of the vector modulator 100.

Many embodiments illustrated herein are nearly all-passive, where the active components are the four programmable/controllable attenuators and associated control circuitry. Since the noise figure of good attenuators is typically about the same as the attenuation level, this is a low noise design. On the other end, since attenuators are the only "active" components, they are the components that dictate linearity and dynamic range. Very linear, controllable attenuators with high third order input intercept point (IIP3) of +65 dBm or even higher are relatively easy to procure. An example VVA is Integrated Device Technology's F2258 VVA that can be controlled using a voltage applied through a high-resolution Digital-to-Analog converter (DAC). This nearly all-passive design therefore produces very low intermodulation distortion (IMD) products.

Figure 5:
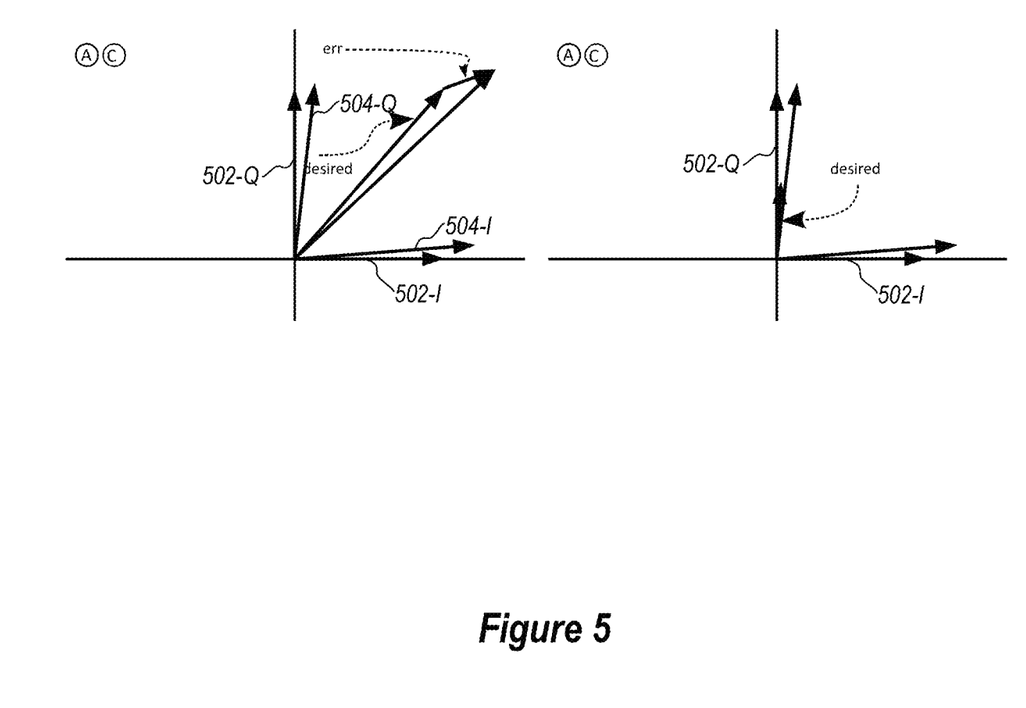
FIG. 5 illustrates the effects of imperfect I and Q vectors.

In a typical vector modulator, the quadrature vectors are not exactly placed on the I & Q axes but rather offset to some extent due to phase and magnitude offsets in 90° and 180° hybrid coupler splitters. However, using the invention illustrated herein, embodiments can more accurately place the vectors than occurs in other approaches by using 4 instead of only 2 vectors. FIG. 5 illustrates an example of imperfect I & Q separation and the effects on vector modulator performance.

In FIG. 5 vectors 502-I and 502-Q represent ideal quadrature separation, whereas vectors 504-I and 504-Q represent I & Q that may be seen in a practical implementation.

Figure 6:
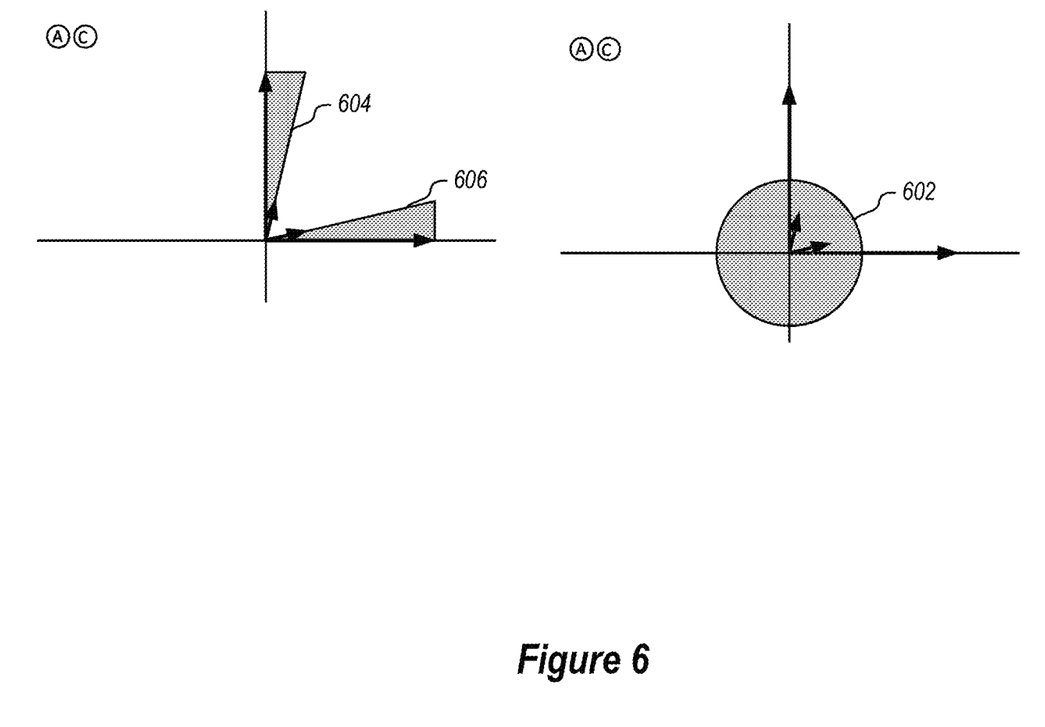
FIG. 6 illustrates regions of unachievable vectors.

As traditional vector modulators only operate in one quadrant at the time, there is a number of vector realizations that are not possible with these traditional vector modulators. FIG. 6 shows a few such examples. FIG. 6 at 602 shows a circle of vectors that are not achievable (unless input signal is zero) using traditional approaches as each of the (non-ideal) I and Q vectors always have some magnitude. This is the case because on a non-zero input signal the attenuators can only affect a limited attenuation on the signal (e.g., 30 dB attenuation) which consequently leaves non-zero I & Q. FIG. 6 also illustrates other regions of unachievable vectors using traditional vector modulators at 604 and 606.

Note that attenuators have a limited dynamic range which means, among other things, that they cannot attenuate signals infinitely. In other words, the component I & Q vectors cannot be zero but rather something larger than that (e.g., 30 dB attenuation of the signal leaves non-zero I & Q). This means that some regions of vectors cannot be reached with traditional designs but can be reached with designs implementing embodiments of the present invention. This is true even using attenuators with limited dynamic range as the embodiments illustrated herein have two sets of the I & Q vectors that can point in opposite directions, reaching areas close to and including origin (0,0) of the I/O plot.

Furthermore, since phase imbalance and amplitude imbalance can be addressed, vector modulators implementing principles of the invention can tolerate larger phase/amplitude imbalances, which consequently means that embodiments can trade-off those parameters for some other parameters that might be more important for the overall performance such as isolation, voltage standing wave ratio (VSWR), bandwidth or response flatness over bandwidth, etc.

Note that some previous vector modulators use switches to switch between positive and negative I and Q vectors. However, switches have limited isolation levels. This means that there will always be some signal from the undesired path coming through that cannot be subtracted, resulting in degraded performance. In contrast, embodiments of the present invention use all four vector components in a given modulation, without the need for switches, such that switch caused isolation problems can be eliminated.

By having multiple degrees of freedom as shown, embodiments can maximize the linearity (i.e., IIP3) by operating VVAs (e.g., attenuators 106-1, 106-2, 106-3, and 106-4) in the most linear regions of low and high attenuation values.

Embodiments may include one or more levels of error correction, significantly improving performance of the vector modulator 100. For example, some embodiments compensate for non-perfect vector phase. As noted previously, vectors are not perfectly 90° apart. Embodiments can compensate for this by individually changing attenuation on each of the attenuators 106-1, 106-2, 106-3, and 106-4. As illustrated in FIG. 3, these attenuators can be controlled by a vector modulator controller 112 being configured to compensate for non-perfect vector phase. In some embodiments, the vector modulator controller 112 may include an ability to calibrate the vector modulator 100 to identify mismatches in offsets. If these offsets are due to inherent characteristics of the hybrid couplers 102-1, 102-2, and 102-3, this calibration can be performed at the factory. However, if these offsets change due to temperature or other differences, then the vector modulator controller 112 can be programed to perform calibration at start-up, or even over time/temperature as the vector modulator 100 is used. Some embodiments may have continuous feedback and control mechanisms to adjust for changing offsets.

Some embodiments may include compensation for nonperfect vector magnitude. Vectors are not perfectly of the same magnitude. Embodiments compensate for this by individually changing attenuation on each of the attenuators 106-1, 106-2, 106-3, and 106-4. Again, as illustrated previously, the vector modulator controller 112 may include functionality for calibration and/or continuous vector magnitude compensation.

In some embodiments, given that the attenuators 106-1, 106-2, 106-3, and 106-4 are individually controlled, they can be run at a most efficient linear point. In particular, the vector modulator controller can coordinate how the attenuators are used, in concert, to maximize linearity for all attenuators. In particular, the vector modulator controller 112 can store performance information about each of the attenuators. This information may be based on manufacturer's information provided in spec sheets, based on calibration testing, or via other means. Because of the 4 vector solution illustrated herein, attenuation levels for each of the vectors can be selected to maximize overall linearity and/or linearity for individual attenuators.

Some embodiments may include compensation of the attenuator slope. Note that slope attenuators can be either static or with programmable slope, where the slope is controlled from the vector modulator controller112.

Using the vector modulator controller 112, some embodiments may implement a system where control of the system is digital, but the signal path of signals through the system is analog.

In some embodiments, using the minimized controls illustrated herein, instead of the more complex controls implemented in phase shifters and other similar components, there is smaller (control loop) delay and thus better dynamic response.

The following discussion now refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

Figure 7:
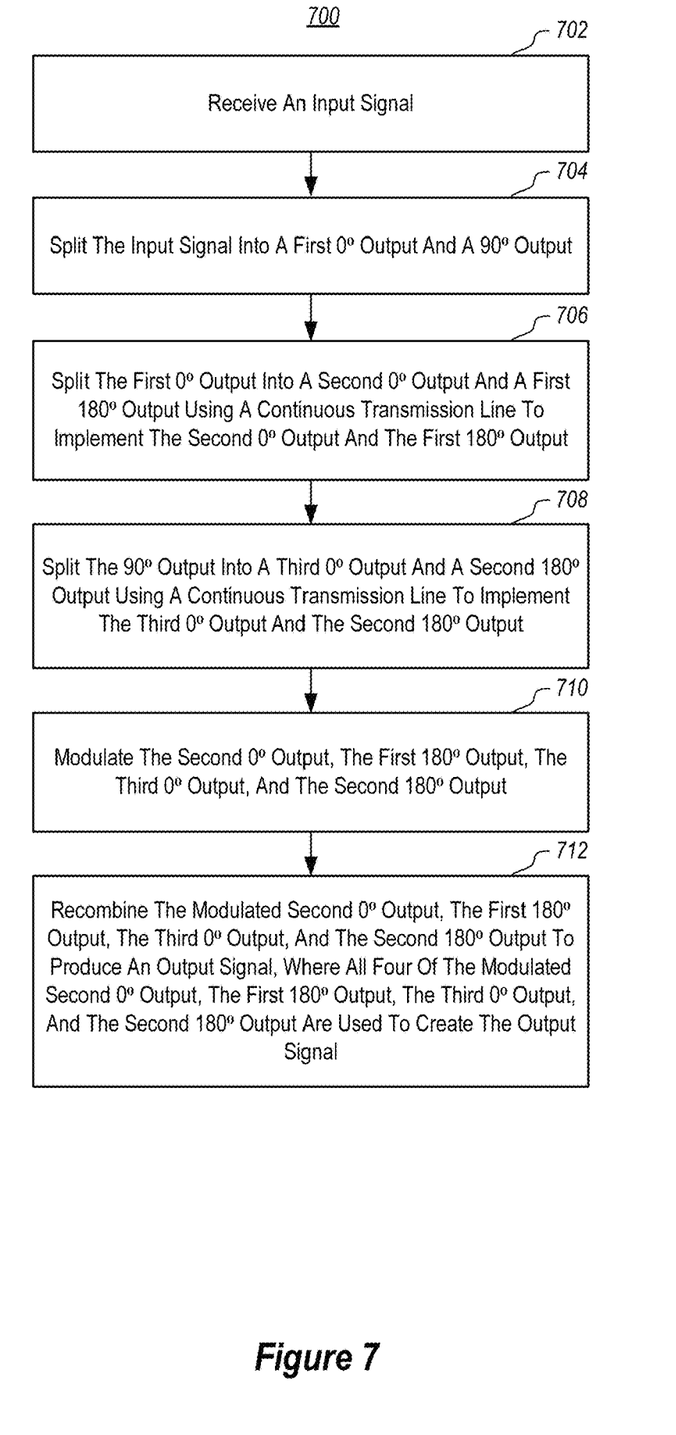
FIG. 7 illustrates a method of vector modulation.

Referring now to FIG. 7, a method 700 is illustrated. The method 700 includes acts for performing vector modulation. The method 700 includes receiving an input signal (act 702). For example, as illustrated in FIG. 1, an input signal can be received at the RF hybrid coupler 102-1.

The method 700 further includes splitting the input signal into a first 0° output and a 90° output (act 704). For example, FIG. 1 illustrates the RF hybrid coupler 102-1 splitting the input signal into a 0° output and a 90° output.

The method 700 further includes splitting the first 0° output into a second 0° output and a first 180° output using a continuous transmission line to implement the second 0° output and the first 180° output (act 706). The method 700 further includes splitting the 90° output into a third 0° output and a second 180° output using a continuous transmission line to implement the third 0° output and the second 180° output (act 708). For example, FIG. 1 illustrates the hybrid couplers 102-2 and 102-3 respectively, splitting signals into 0° and 180° outputs.

The method 700 further includes modulating the second 0° output, the first 180° output, the third 0° output, and the second 180° output (act 710). For example, FIG. 1 illustrates the controllable attenuators 106-1, 106-2, 106-3, and 106-4 being used to modulate the amplitude of the outputs of the hybrid couplers 102-2 and 102-3.

The method 700 further includes recombining the modulated second 0° output, the first 180° output, the third 0° output, and the second 180° output to produce an output signal, where all four of the modulated second 0° output, the first 180° output, the third 0° output, and the second 180° output are used to create the output signal (act 712). FIG. 1 illustrates an RF power combiner 108 used to perform this action.

The method 700 may further include equalizing a slope of the input signal prior to splitting the input signal. FIG. 4 illustrates an example of this being performed by the slope equalizer 114. This may be performed where equalizing slope is performed in a fixed equalization fashion. Alternatively, this may be performed where equalizing slope is performed in a variable equalization fashion.

The method 700 may further include equalizing slope of the second 0° output, the first 180° output, the third 0° output, and the second 180° output prior to recombining the modulated second 0° output, the first 180° output, the third 0° output, and the second 180° output. FIG. 3 illustrates an example of this being performed by the slope equalizers 110-1, 110-2, 110-3, and 110-4.

The method 700 may be performed where the acts are performed to attenuate the input signal. For example, using the system illustrated herein, embodiments can implement a much more efficient and precise attenuator than has been possible with other systems which have limited attenuation capabilities.

Further, the methods may be practiced by a computer system including one or more processors and computer-readable media such as computer memory. In particular, the computer memory may store computer-executable instructions that when executed by one or more processors cause various functions to be performed, such as the acts recited in the embodiments.

Embodiments of the present invention may comprise or utilize a special purpose or general-purpose computer including computer hardware, as discussed in greater detail below. Embodiments within the scope of the present invention also include physical and other computer-readable media for carrying or storing computer-executable instructions and/or data structures. Such computer-readable media can be any available media that can be accessed by a general purpose or special purpose computer system. Computer-readable media that store computer-executable instructions are physical storage media. Computer-readable media that carry computer-executable instructions are transmission media. Thus, by way of example, and not limitation, embodiments of the invention can comprise at least two distinctly different kinds of computer-readable media: physical computer-readable storage media and transmission computer-readable media.

Physical computer-readable storage media includes RAM, ROM, EEPROM, CD-ROM or other optical disk storage (such as CDs, DVDs, etc.), magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry desired program code means in the form of computer-executable instructions or data structures and which can be accessed by a general purpose or special purpose computer. Combinations of the above are also included within the scope of computer-readable media.

Further, upon reaching various computer system components, program code means in the form of computer-executable instructions or data structures can be transferred automatically from transmission computer-readable media to physical computer-readable storage media (or vice versa). For example, computer-executable instructions or data structures received over a network or data link can be buffered in RAM within a network interface module (e.g., a "NIC"), and then eventually transferred to computer system RAM and/or to less volatile computer-readable physical storage media at a computer system. Thus, computer-readable physical storage media can be included in computer system components that also (or even primarily) utilize transmission media.

Computer-executable instructions comprise, for example, instructions and data which cause a general purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Alternatively, or in addition, the functionality described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

The present invention may be embodied in other specific forms without departing from its characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A hybrid RF vector modulator comprising:
   a first RF hybrid coupler comprising an input port, a 0° output port configured to output with a 0° shift and a 90° output port configured to output with a 90° shift;
   a second RF hybrid coupler, coupled to the 0° output port of the first RF hybrid coupler, comprising an input port, a 0° output port configured to output with a 0° shift and a 180° output port configured to output with a 180° shift and using a continuous transmission line to implement the 0° shift and the 180° shift; and
   a third RF hybrid coupler, coupled to the 90° output port of the first RF hybrid coupler, comprising an input port, a 0° output port configured to output with a 0° shift and a 180° output port configured to output with a 180° shift and using a continuous transmission line to implement the 0° shift and the 180° shift;
a first controllable attenuator coupled to the 0° output port of the second RF hybrid coupler;
a second controllable attenuator coupled to the 180° output port of the second RF hybrid coupler;
a third controllable attenuator coupled to the 0° output port of the third RF hybrid coupler;
a fourth controllable attenuator coupled to the 180° output port of the third RF hybrid coupler;
an RF power combiner coupled to outputs of the first, second, third, and fourth controllable attenuators, and configure to output a signal composed of outputs from all of the first, second, third, and fourth controllable attenuators;
a vector modulator controller coupled to the first, second, third, and fourth controllable attenuators to control output signal magnitudes by controlling attenuation of the first, second, third, and fourth controllable attenuators; and
one or more gain slope equalizers configured to perform at least one of equalizing a slope of an input signal prior to input into the first RF hybrid coupler or equalizing slopes of signals prior to input into the RF power combiner.

2. The vector modulator of claim 1, wherein the one or more gain slope equalizers comprises first, second, third, and fourth slope equalizers coupled between the outputs of the first, second, third, and fourth controllable attenuators, respectively, and the RF power combiner.

3. The vector modulator of claim 2, wherein the first, second, third, and fourth slope equalizers are fixed slope equalizers.

4. The vector modulator of claim 2, wherein the first, second, third, and fourth slope equalizers are variable slope equalizers.

5. The vector modulator of claim 4, wherein the first, second, third, and fourth slope equalizers are couped to the vector modulator controller, and wherein the vector modulator controller is configured to compensate for environmental considerations.

6. The vector modulator of claim 2, wherein the first, second, third, and fourth slope equalizers are configured to compensate for circuit component losses.

7. The vector modulator of claim 2, wherein the first, second, third, and fourth slope equalizers are configured to compensate for circuit component imperfections.

8. The vector modulator of claim 1, wherein the one or more gain slope equalizers comprises a slope equalizer coupled to the first RF hybrid coupler.

9. The vector modulator of claim 8, wherein the slope equalizer is configured or compensated for at least one of environmental considerations or circuit component losses.

10. The vector modulator of claim 8, wherein the slope equalizer is variable.

11. A method of performing vector modulation, the method comprising:
receiving an input signal;
splitting the input signal into a first 0° output and a 90° output;
splitting the first 0° output into a second 0° output and a first 180° output using a continuous transmission line to implement the second 0° output and the first 180° output;
splitting the 90° output into a third 0° output and a second 180° output using a continuous transmission line to implement the third 0° output and the second 180° output;
modulating the second 0° output, the first 180° output, the third 0° output, and the second 180° output;
recombining the modulated second 0° output, the first 180° output, the third 0° output, and the second 180° output to produce an output signal, where all four of the modulated second 0° output, the first 180° output, the third 0° output, and the second 180° output are used to create the output signal; and
equalizing a slope of either the input signal prior to splitting the input signal or equalizing slope of the second 0° output, the first 180° output, the third 0° output, and the second 180° output prior to recombining the modulated second 0° output, the first 180° output, the third 0° output, and the second 180° output.

12. The method of claim 11, wherein equalizing a slope of either the input signal prior to splitting the input signal or equalizing slope of the second 0° output, the first 180° output, the third 0° output, and the second 180° output prior to recombining the modulated second 0° output, the first 180° output, the third 0° output, and the second 180° output comprises equalizing a slope of the input signal prior to splitting the input signal.

13. The method of claim 11, wherein equalizing the slope or the slopes is performed in a fixed equalization fashion.

14. The method of claim 11, wherein equalizing the slope or the slopes is performed in a variable equalization fashion.

15. The method of claim 11, wherein equalizing the slope of either the input signal prior to splitting the input signal or equalizing the slopes of the second 0° output, the first 180° output, the third 0° output, and the second 180° output prior to recombining the modulated second 0° output, the first 180° output, the third 0° output, and the second 180° output comprises equalizing the slopes of the second 0° output, the first 180° output, the third 0° output, and the second 180° output prior to recombining the modulated second 0° output, the first 180° output, the third 0° output, and the second 180° output.

16. The method of claim 11, wherein the acts are performed to attenuate the input signal.

17. The method of claim 11, wherein a signal path is analog, but where vector modulator controls are digital.

18. A vector modulator controller configured to control a vector modulator, the vector modulator controller comprising:
one or more processors; and
one or more computer-readable media having stored thereon instructions that are executable by the one or more processors to configure the processors to control a vector modulator, including instructions that are executable to configure the processors to perform at least the following:
modulate output signals from first, second, third, and fourth controllable attenuators to control output signal magnitudes from signals received from first, second, and third RF hybrid output couplers, wherein the first RF hybrid coupler comprises an input port, a 0° output port configured to output with a 0° shift and a 90° output port configured to output with a 90° shift, the second RF hybrid coupler, coupled to the 0° output port of the first RF hybrid coupler, comprising an input port, a 0° output port configured to output with a 0° shift and a 180° output port configured to output with a 180° shift and using a continuous transmission line to implement the 0° shift and the 180° shift and the third RF hybrid coupler, coupled to the 90° output port of the first RF hybrid coupler, comprising an input port, a 0° output port configured to output with a 0° shift and a 180° output port configured to output with a 180° shift and using a continuous transmission line to implement the 0° shift and the 180° shift; and control one or more slope equalizers to compensate for losses and bandwidth dependent imperfections of the vector modulator.

19. The vector modulator controller of claim 18, wherein controlling one or more slope equalizers comprises controlling a slope equalizer on an input side of the first RF hybrid coupler.

20. The vector modulator controller of claim 18, wherein controlling one or more slope equalizers comprises controlling a plurality of slope equalizers located between the first, second, and third RF hybrid output couplers and a power combiner configured to combine signals from the first, second, and third RF hybrid output couplers.

* * * * *